United States Patent
Kwong et al.

(10) Patent No.: US 7,209,726 B2
(45) Date of Patent: Apr. 24, 2007

(54) SWITCH IN UHF BANDPASS

(75) Inventors: Kam Choon Kwong, Singapore (SG);
Yeow Teng Toh, Singapore (SG); Siow Ling Teo, Singapore (SG)

(73) Assignee: PXP B.V., Eindhoven (NL)

( * ) Notice: Subject to any disclaimer, the term of this patent is extended or adjusted under 35 U.S.C. 154(b) by 328 days.

(21) Appl. No.: 10/475,885

(22) PCT Filed: Apr. 24, 2002

(86) PCT No.: PCT/IB02/01487

§ 371 (c)(1),
(2), (4) Date: Oct. 24, 2003

(87) PCT Pub. No.: WO02/089327

PCT Pub. Date: Nov. 7, 2002

(65) Prior Publication Data

US 2004/0108916 A1 Jun. 10, 2004

(30) Foreign Application Priority Data

Apr. 27, 2001 (SG) .................... PCT/SG01/00080

(51) Int. Cl.
*H04B 1/16* (2006.01)

(52) U.S. Cl. .................... 455/334; 455/313; 455/307; 455/188.1

(58) Field of Classification Search ............. 455/188.1, 455/188.2, 190.1, 191.3, 552.1, 553.1, 180.1, 455/313–334, 307
See application file for complete search history.

(56) References Cited

U.S. PATENT DOCUMENTS

| | | | | |
|---|---|---|---|---|
| 3,396,395 | A * | 8/1968 | Ball et al. | 455/313 |
| 3,525,941 | A * | 8/1970 | Smith | 455/323 |
| 3,931,578 | A * | 1/1976 | Gittinger | 455/314 |
| 4,115,737 | A * | 9/1978 | Hongu et al. | 455/189.1 |
| 4,132,952 | A * | 1/1979 | Hongu et al. | 455/188.1 |
| 4,244,055 | A * | 1/1981 | Misawa et al. | 455/188.1 |
| 4,392,254 | A * | 7/1983 | Ecklund | 455/180.1 |
| 4,723,306 | A * | 2/1988 | Fuenfgelder et al. | 455/114.1 |
| 5,790,959 | A * | 8/1998 | Scherer | 455/314 |
| 6,249,686 | B1 * | 6/2001 | Dvorkin et al. | 455/333 |
| 6,313,688 | B1 * | 11/2001 | Lee et al. | 327/359 |
| 6,344,881 | B1 * | 2/2002 | Endo | 455/180.1 |
| 6,584,304 | B1 * | 6/2003 | Thomsen et al. | 455/307 |
| 6,996,384 | B2 * | 2/2006 | Yamawaki et al. | 455/307 |
| 7,058,379 | B2 * | 6/2006 | Draijer | 455/323 |
| 7,088,980 | B2 * | 8/2006 | Otaka | 455/323 |
| 2005/0024544 | A1 * | 2/2005 | Waight et al. | 455/191.3 |

* cited by examiner

*Primary Examiner*—Lana Le

(57) ABSTRACT

By using ICs with combined inputs for the VHF-high bandpass circuit and the UHF bandpass circuit, undesirable resonances occur which are caused by one of the tuned circuits. The problem is solved by providing a switching means for decoupling the UHF bandpass circuit from the combined inputs when a VHF-high band signal is received by the VHF-high bandpass circuit. The switching means comprises a switch coupled between the UHF bandpass circuit and the common inputs.

7 Claims, 4 Drawing Sheets

SWITCH IN UHF BANDPASS

BACKGROUND OF THE INVENTION

The invention relates to a tuner with a UHF bandpass circuit and a VHF bandpass circuit.

U.S. Pat. No. 6,225,865 discloses a switching circuit for switching among antennas, which have different directivities. The switching circuit provides insulation for an "off" signal in VHF/UHF bands of frequencies without requiring an additional attenuation circuit. It includes an amplifier for amplifying an input signal and a switching device for coupling the amplified signal to a common output. The switching circuit also comprises a control circuit, which is responsive to a first state of a control signal for simultaneously causing the switching device to be in a conductive state and enabling the amplifier to amplify the input signal. The control circuit is also responsive to a second state of the control signal for simultaneously causing the switching device to be in a non-conductive state and removing a DC operating voltage from the amplifier for further insulating the input signal from the output.

BRIEF SUMMARY OF THE INVENTION

It is, inter alia, an object of the invention to decouple a first bandpass circuit from common inputs when a second bandpass circuit presents an output signal on the common inputs.

The present invention solves the described problem by providing a tuner comprising: a first bandpass circuit for receiving a first signal in a first broadcast band and having first output terminals to supply a first output signal, a second bandpass circuit for receiving a second signal in a second broadcast band and having second output terminals to supply a second output signal, a mixer circuit having common inputs for receiving both the first output signal and the second output signal, and a switching means for decoupling the first bandpass circuit from at least one of the common inputs when the second output signal should be present on the common inputs.

According to one embodiment of the invention, the first broadcast band is the UHF band and the second broadcast band is the VHF-H band. The switching means comprise a switch coupled between at least one of the first output terminals and the corresponding one of the common inputs.

In accordance with another feature of the invention, the switching means comprises a switch for short-circuiting the first output signal and the switch is a diode which is controllable by a bias voltage.

BRIEF DESCRIPTION OF THE DRAWINGS

The invention may be better understood by referring to the enclosed drawing in which.

DETAILED DESCRIPTION OF THE INVENTION

Figure 1:
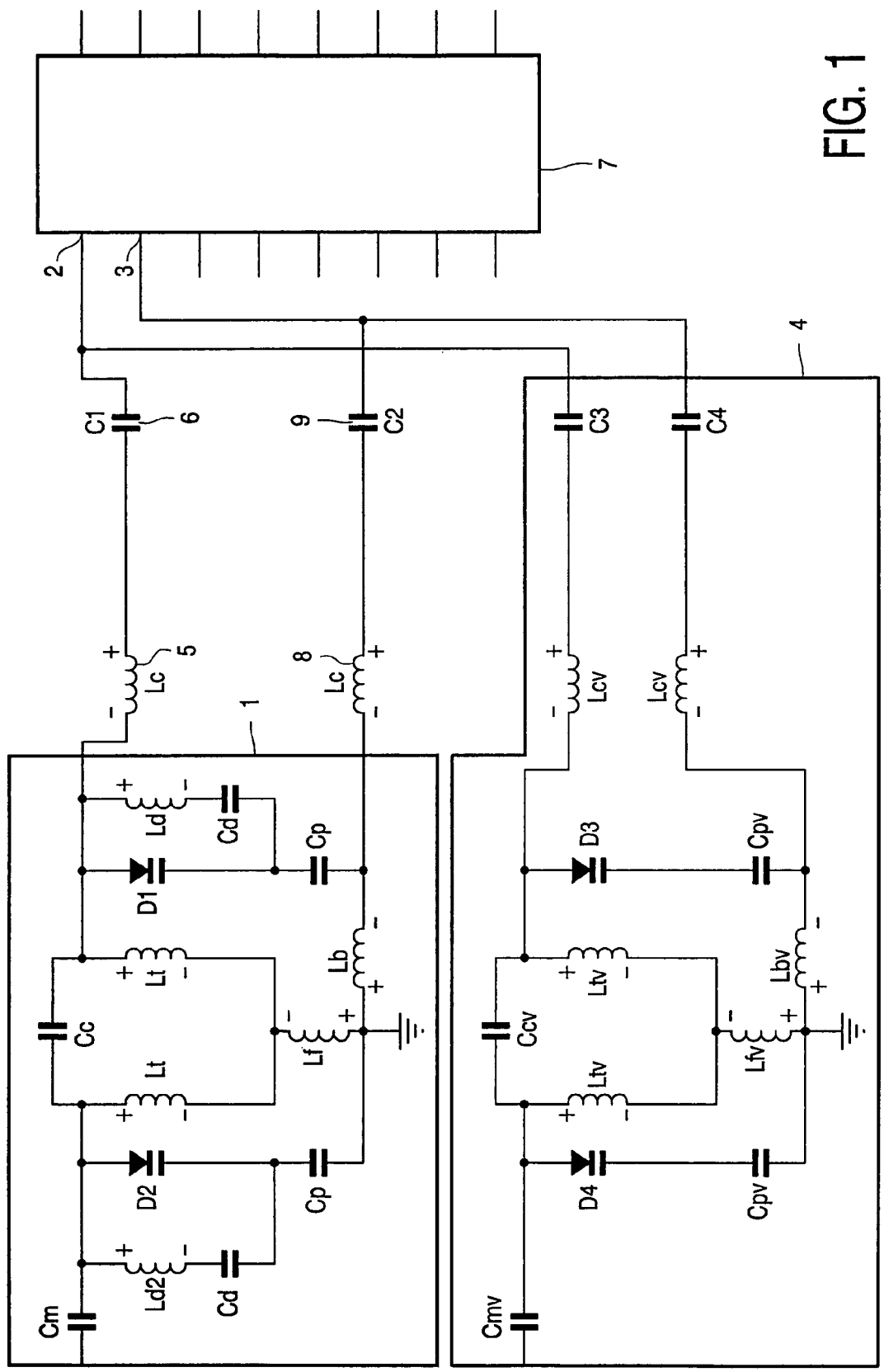
FIG. 1 shows, in a schematic diagram form, an embodiment of a UHF double tuned bandpass filter.

FIG. 1 shows an embodiment of a first bandpass circuit and a second bandpass circuit connected to a mixer circuit having common inputs for both the first and the second bandpass circuit. The first bandpass circuit is a typical UHF bandpass filter 1 for receiving a signal in a UHF band and having first output terminals to supply the signal. The second bandpass circuit is a VHF High bandpass filter 4 for receiving a signal in a VHF band and having second output terminals to supply the signal. Both output terminals are connected to a combined input 2, 3 of a mixer circuit. The mixer circuit is a Mixer and Oscillator Phase Locked Loop (MOPLL/MO) IC 7.

A signal received by the UHF bandpass filter 1 reaches the IC 7 through coupling elements. Coupling elements are a coil 5, which is connected in series with the capacitor 6 to the input 2 of the IC 7 and coil 8 and capacitor 9, which is connected in series with the input 3 of the IC 7. When the VHF High bandpass filter 4 receives a signal, undesirable resonances occur while tuning in the VHF-High band 4. These undesirable resonances are found by components of the UHF bandpass circuit 1.

Figure 2:
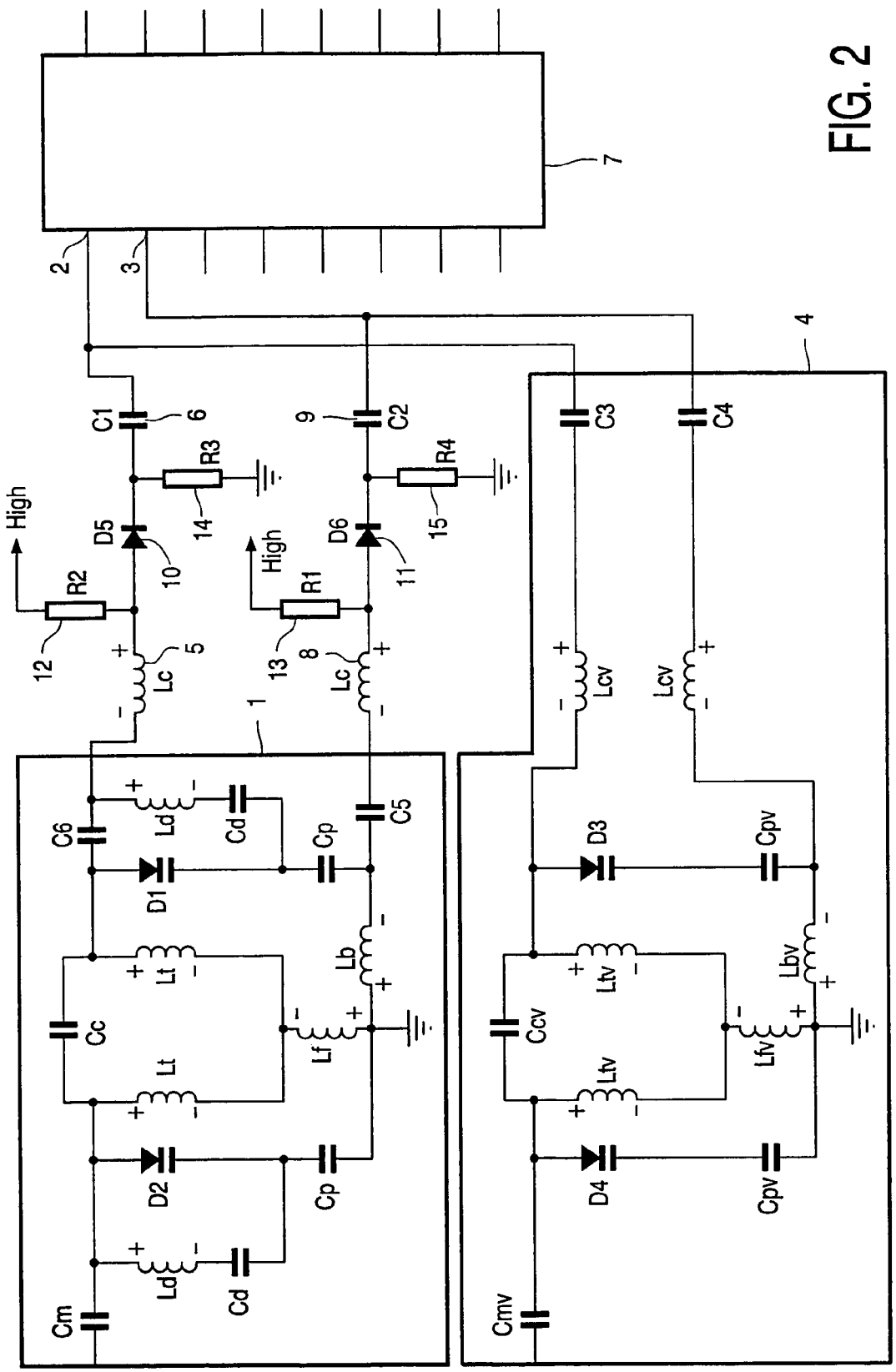
FIG. 2 shows, in a schematic diagram form, an embodiment of a UHF double tuned bandpass filter with two switching diodes.

In FIG. 2, a switching means such as an additional switching diode 10 is connected in series between the coil 5 and capacitor 6 of the UHF double-tuned bandpass filter shown in FIG. 1. A second additional switching diode 11 is connected in series between the coil 6 and capacitor 9. A control current is fed to the connection of the switching diode 10 via a resistor 12. A second control current is fed to the connection of the switching diode 11 via a resistor 13. At the point of connection of the diode 10 and the capacitor 6, a shunt resistor 14 is connected to ground. At the point of connection of the diode 11 and the capacitor 9, a shunt resistor 15 is also connected to ground. The diodes 10 and 11 are preferably Schottky barrier or PIN diodes.

A signal received by the UHF bandpass filter 1 reaches the input 2 of the IC 7 through the coil 5, the diode 10 and capacitor 6 and the input 3 through the coil 8, the diode 11 and capacitor 9. Diodes 10, 11 act as a switch by blocking a signal when VHF-High bandpass circuit 4 receives a signal. This prevents the undesirable resonances caused by the UHF bandpass circuit 1 and the signal reaches the inputs 2, 3 of IC 7.

Figure 3:
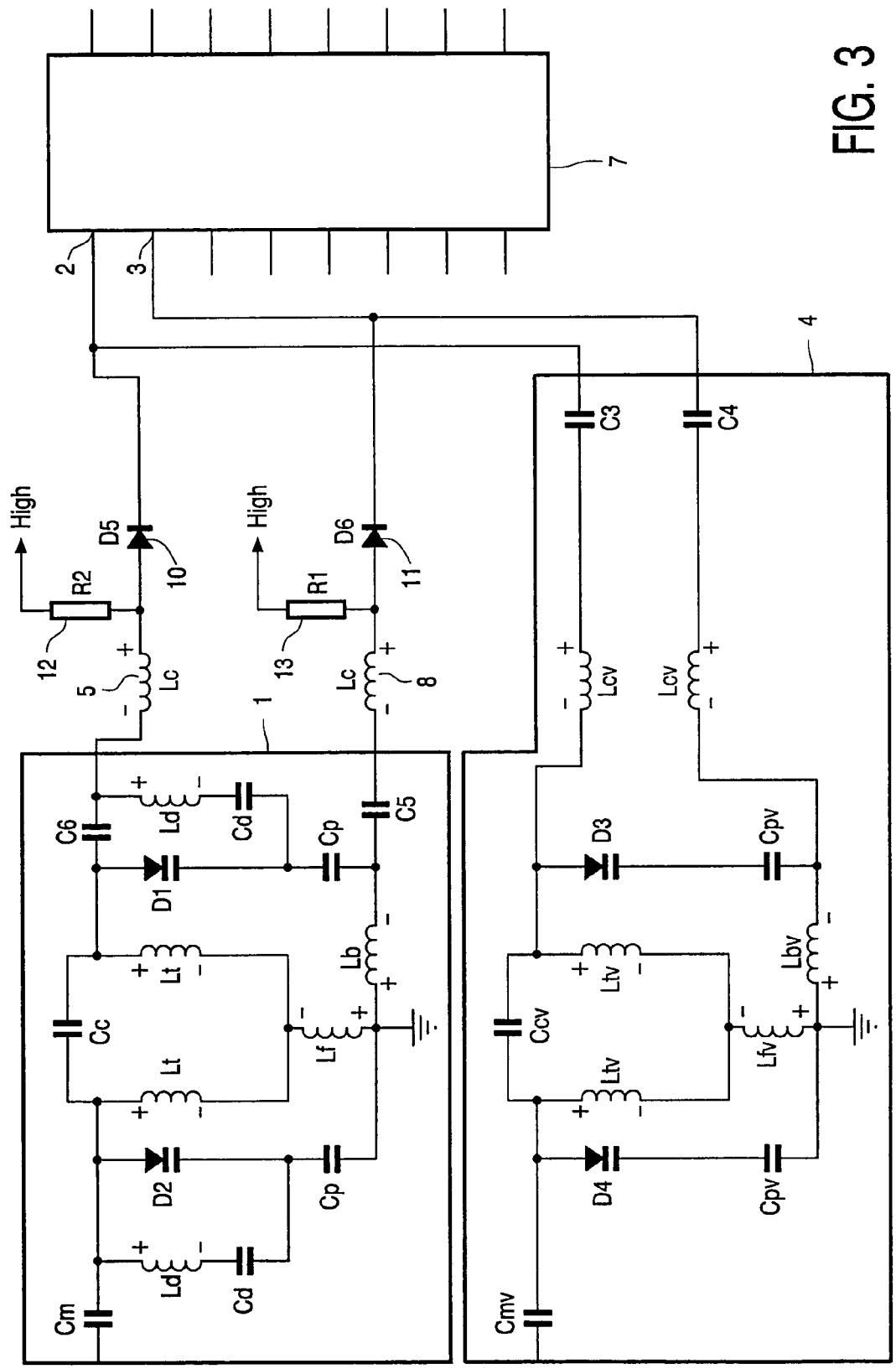
FIG. 3 shows, in a schematic diagram form, an embodiment of a UHF double tuned bandpass filter with two switching diodes and reverse biasing.

FIG. 3 shows the additional switching diodes 10, 11 with reverse biasing. The diodes are reversed by making use of the IC DC biasing. The diode 10 is directly connected to the input 2 of the IC 7 without the shunt resistor 14 and capacitor 6 as shown in FIG. 2. The diode 11 is directly connected to the input 3 of the IC 7 without the shunt resistor 15 and capacitor 9 as shown in FIG. 2.

A signal received by the UHF bandpass filter 1 reaches the input 2 of the IC 7 through the coil 5, the diode 10 and the input 3 through the coil 8, and the diode 11. Diodes 10, 11 act as a switch by blocking a signal when VHF-High bandpass circuit 4 receives a signal. This has the advantage that the undesirable resonances are prevented, and the capacitance is futher reduced when the diodes are switched OFF.

Figure 4:
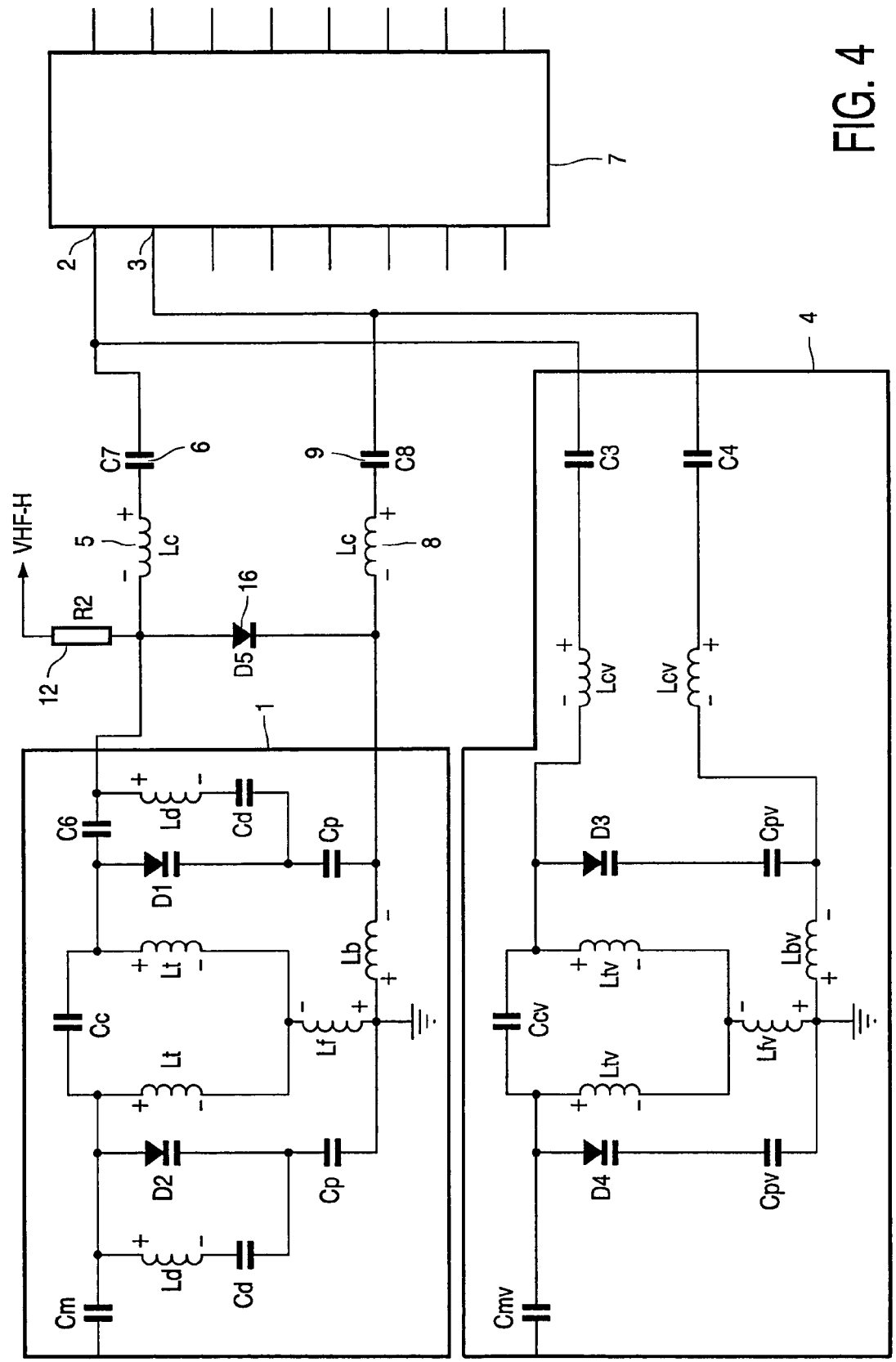
FIG. 4 shows, in a schematic diagram form, an embodiment of a UHF double tuned bandpass filter with a single switching diode.

In FIG. 4 the UHF bandpass filter 1 is connected to the inputs 2 and 3 through the coupling elements, i.e. coils 5, 8, and capacitors 6, 9 as described in FIG. 1. The VHF High bandpass filter 4 is also connected to the combined input 2, 3 of the IC 7 as shown in FIG. 1. An additional switching diode 16 is connected to the points of connection of the UHF bandpass filter 1 and the respective coils 5, 8. A control current is supplied to the diodes 16 by a resistor 17, which is connected to the points of connection of the UHF bandpass filter 1 and the coil 5.

A signal received by the UHF bandpass filter 1 reaches the IC 7 through the coil 5, 8, and capacitor 6, 9. When the VHF-High band receives a signal, the UHF bandpass filter 1 is short-cut by the additional diode 16. Thus, the received signal reaches the inputs 2, 3 of the IC 7.

The invention claimed is:

1. A tuner comprising:
   a first bandpass circuit that is configured to receive a first signal in a first broadcast band and having first output terminals to supply a first output signal,
   a second bandpass circuit that is configured to receive a second signal in a second broadcast band and having second output terminals to supply a second output signal,
   a mixer circuit having at least one common inputs that is configured to receive both the first output signal from one of the first output terminals and the second output signal from one of the second output terminals, and
   one or more switches that are controlled by one or more control signals that are applied to the common inputs, and are configured to selectively decouple the first bandpass circuit from at least one of the common inputs when the second output signal should be present on the common inputs.

2. The tuner of claim 1, wherein the first broadcast band is the UHF band, and the second broadcast band is the VHF-H band.

3. The tuner of claim 1, wherein the one or more switches include a switch coupled between at least one of the first output terminals and the corresponding one of the common inputs.

4. The tuner of claim 3, wherein the switch is a diode that is controllable by a bias voltage.

5. The tuner of claim 1, wherein the one or more switches include a switch that is configured to short-circuit the first output signal.

6. The tuner of claim 5, wherein the switch is a diode that is controllable by a bias voltage.

7. The tuner of claim 1, wherein the mixer includes an integrated circuit that is configured to provide the one or more control signals via one or more pins that correspond to the common inputs.

* * * * *